US011967631B1

(12) United States Patent
Feng et al.

(10) Patent No.: US 11,967,631 B1
(45) Date of Patent: Apr. 23, 2024

(54) POWER SEMICONDUCTOR DEVICE AND MANUFACTURING METHOD THEREOF

(71) Applicant: JSAB Technologies (Shenzhen) Ltd., Shenzhen (CN)

(72) Inventors: Hao Feng, Shenzhen (CN); Yong Liu, Shenzhen (CN); Jing Deng, Shenzhen (CN); Johnny Kin On Sin, Shenzhen (CN)

(73) Assignee: JSAB TECHNOLOGIES (SHENZHEN) LTD., Guangdong (CN)

( * ) Notice: Subject to any disclaimer, the term of this patent is extended or adjusted under 35 U.S.C. 154(b) by 0 days.

(21) Appl. No.: 18/497,588

(22) Filed: Oct. 30, 2023

(30) Foreign Application Priority Data

Jun. 8, 2023 (CN) .......................... 202310672338.0

(51) Int. Cl.
*H01L 29/66* (2006.01)
*H01L 29/06* (2006.01)
*H01L 29/739* (2006.01)

(52) U.S. Cl.
CPC .... *H01L 29/66348* (2013.01); *H01L 29/0696* (2013.01); *H01L 29/7397* (2013.01)

(58) Field of Classification Search
CPC .......... H01L 29/66348; H01L 29/0696; H01L 29/7397
USPC ........................................................ 257/139
See application file for complete search history.

(56) References Cited

U.S. PATENT DOCUMENTS

| 2014/0054644 | A1* | 2/2014 | Hikasa | ................ H01L 29/0696 257/139 |
| 2014/0077256 | A1* | 3/2014 | Hikasa | ................ H01L 29/7397 257/139 |
| 2016/0359026 | A1* | 12/2016 | Matsuura | .......... H01L 29/66348 |
| 2017/0154965 | A1 | 6/2017 | Siemieniec et al. | |
| 2022/0069111 | A1* | 3/2022 | Imai | .................... H01L 29/7397 |

FOREIGN PATENT DOCUMENTS

| CN | 102354707 A | | 2/2012 | |
| CN | 103247681 A | | 8/2013 | |
| CN | 106997899 A | * | 8/2017 | ......... H01L 29/0615 |
| CN | 116093162 A | | 5/2023 | |
| EP | 1 788 634 A1 | | 5/2007 | |

* cited by examiner

*Primary Examiner* — Igwe U Anya
(74) *Attorney, Agent, or Firm* — MUNCY, GEISSLER, OLDS & LOWE, P.C.

(57) ABSTRACT

The present disclosure provides a power semiconductor device and a manufacturing method thereof. In order to provide a power semiconductor device with improved latch-up immunity but without increasing device power loss and costs, a hole current path in a fourth semiconductor region of a first conductivity type between a gate trench and a dummy gate trench is shortened by providing a first contact trench between two adjacent gate trenches, and providing a second contact trench between the gate trench and a dummy gate trench such that the width and depth of the second contact trench are respectively greater than those of the first contact trench. The effect of the hole current on the potential rise of the fourth semiconductor region of the first conductivity type is suppressed, thereby suppressing the latch-up effect, and enhancing the switching reliability.

10 Claims, 12 Drawing Sheets

POWER SEMICONDUCTOR DEVICE AND MANUFACTURING METHOD THEREOF

TECHNICAL FIELD

The present disclosure relates to a structure of a power semiconductor device, in particular to an insulated gate bipolar transistor, and a manufacturing method thereof.

BACKGROUND

An Insulated Gate Bipolar Transistor (hereinafter referred to as "IGBT") is an important power semiconductor device which is widely used in various areas of medium-high power electronic systems at present, such as electric vehicles, photovoltaic energy storage, industrial motor drives, uninterruptible power supplies, etc. With the continuous iteration and development of IGBT technology, the size of IGBT chip decreases, and the density of conduction current increases. Higher current density presents higher challenges to the energy dissipation and reliability of the IGBT.

A summary of the current relevant technical background of IGBT is provided below.

A schematic cross-sectional view showing an IGBT device 100 in the prior art is as shown in FIG. 1. In order to reduce the gate parasitic capacitance of the IGBT and increase the switching speed, the surface of the device 100 is provided with a series of dummy gate trenches 210 arranged in parallel with the gate trenches 110, a dummy gate electrode 124 is provided in the dummy gate trenches 210, and the dummy gate electrode is coupled to the emitter electrode 121. In addition, there is no contact trench (310) between adjacent dummy gate trenches 210, and an electrically floating p-type body region 202 is provided between adjacent dummy gate trenches 210 and is not physically coupled to any electrode, and the function thereof is to store hole carriers in a conduction state to reduce conduction loss of the device 100.

However, one defect of the IGBT device 100 is that when the device 100 is turned off, most of the hole carriers ($h^+$) stored near the electrically floating p-type body region 202 need to flow out of one of the contact trenches (310) closest thereto, resulting in localized concentration of hole current near the p-type body region 102 between an adjacent one of the gate trenches 110 and one of the dummy gate trenches 210, as shown by the dashed lines in FIG. 1. When the hole current density exceeds a certain threshold, a PN junction between the p-type body region 102 and the adjacent $n^+$ type emitter electrode region 103 between the gate trench 110 and the dummy gate trench 210 is opened, causing latch-up failure of the IGBT device 100. This problem is further exacerbated with the shrinking cell-pitch of the IGBT device, since a smaller trench-cell period implies a narrower trench pitch, resulting in a higher hole current density between adjacent gate trenches 110 and dummy gate trenches 210.

SUMMARY

In view showing the above-mentioned problems with IGBT devices in the prior art, it would be desirable to provide a structural design that improves latch-up immunity of the device without increasing power loss and manufacturing cost of the device, and a corresponding method for manufacturing the structure.

An object of the present disclosure is to provide a power semiconductor device comprising an emitter electrode, a collector and a gate electrode, a first semiconductor layer of a first conductivity type being provided on the collector, a second semiconductor layer of a second conductivity type being provided on the first semiconductor layer of the first conductivity type, and a lightly-doped third semiconductor drift region of the second conductivity type being provided on the second semiconductor layer of the second conductivity type;

the lightly-doped third semiconductor drift region of the second conductivity type being provided therein with one or more gate trenches extending from an upper surface of the lightly-doped third semiconductor drift region of the second conductivity type into the third semiconductor drift region, one or more dummy gate trenches parallel to the gate trenches and located near the gate trenches, an electrically floating seventh semiconductor region of a first conductivity type located between adjacent dummy gate trenches and a fourth semiconductor region of a first conductivity type located at a side of the gate trench; a gate electrode being provided in the gate trench, a dummy gate electrode being provided in the dummy gate trench, and the dummy gate electrode being coupled to an emitter electrode;

a heavily-doped fifth semiconductor region of the second conductivity type and a heavily-doped sixth semiconductor region of a first conductivity type being provided on the fourth semiconductor region of a first conductivity type, the heavily-doped fifth semiconductor region of the second conductivity type adjoining the same side wall of the gate trench, and the heavily-doped sixth semiconductor region of a first conductivity type adjoining the fifth semiconductor region;

an insulating dielectric layer located on a drift region of the lightly-doped third semiconductor of the second conductivity type;

a first contact trench being provided between two adjacent gate trenches, a second contact trench being provided between the gate trench and a dummy gate trench, the emitter electrode fills down into the first contact trench and the second contact trench, the first contact trench and the second contact trench adjoin the heavily-doped sixth semiconductor region of a first conductivity type and the fifth semiconductor region at a side thereof respectively, and the width and depth of the second contact trench being respectively greater than those of the first contact trench.

Further, a horizontal spacing between the second contact trench and the adjacent dummy gate trench is less than the horizontal spacing between the second contact trench and the adjacent gate trench.

Further, the bottom of the second contact trench is deeper than a junction depth of the heavily-doped sixth semiconductor region of a first conductivity type and adjoins to be in contact with the underlying fourth semiconductor region of a first conductivity type.

Further, the bottom of the first contact trench is deeper than the bottom of the heavily-doped sixth semiconductor region of a first conductivity type and adjoins the underlying fourth semiconductor region of a first conductivity type.

Further, a first semiconductor region of the first conductivity type and a heavily-doped eighth semiconductor region of the second conductivity type are provided in an alternating arrangement over the collector.

Further, the second contact trench adjoins a sidewall of the dummy gate trench on the side thereof.

Further, the junction depth of the electrically floating seventh semiconductor region of a first conductivity type between adjacent dummy gate trenches is deeper than the junction depth of the fourth semiconductor region of a first conductivity type.

Further, an eighth semiconductor region of the second conductivity type is provided between the lightly-doped third semiconductor drift region of the second conductivity type and the fourth semiconductor region of a first conductivity type.

Further, an auxiliary electrode is provided inside the gate trench, located below and isolated from the gate electrode, and is coupled to an emitter electrode.

Another object of the present disclosure is to provide a method for manufacturing a power semiconductor device, the method comprising the steps of:

first, forming a lightly-doped semiconductor region of the second conductivity type;

second, forming a gate trench, a dummy gate trench, a fourth semiconductor region of a first conductivity type and a seventh semiconductor region of a first conductivity type on an upper surface of the lightly-doped semiconductor region of the second conductivity type;

third, forming a heavily-doped fifth semiconductor region of the second conductivity type on an upper surface of the fourth semiconductor region of a first conductivity type by ion implantation and annealing, and depositing an insulating dielectric layer on the upper surface;

fourth, performing mask etching on the insulating dielectric layer, respectively forming a first etched hole located between two adjacent gate trenches and a second etched hole located between the adjacent gate trench and dummy gate trench, wherein the first etched hole and the second etched hole are in contact with the upper surface of the heavily-doped fifth semiconductor region of the second conductivity type, the width of the second etched hole is greater than the width of the first etched hole, and the horizontal spacing between the second contact hole and the adjacent dummy gate trench is less than the horizontal spacing between same and the adjacent gate trench;

fifth, using the remaining insulating dielectric layer as a mask, implanting ions of the first conductivity type below the first etched hole and the second etched hole, and forming a heavily-doped sixth semiconductor region of a first conductivity type by annealing;

sixth, performing trench etching with the remaining insulating dielectric layer as a mask, and synchronously forming a first contact trench and a second contact trench;

seventh, performing surface metal deposition to form an emitter electrode;

eighth, moderately thinning the lightly-doped semiconductor region of the second conductivity type from its lower surface to reach a target thickness determined by a device withstand voltage value, and then forming a second semiconductor layer and a first semiconductor layer at the bottom of the thinned lightly-doped semiconductor region of the second conductivity type through an ion implantation and activation process; and ninth, metalizing at the bottom of the device to form a collector.

Regarding the IGBT device of the present disclosure, when the device is turned off, although the hole current density in the fourth semiconductor region of a first conductivity type between the adjacent gate trench and the dummy gate trench is similar to that of the IGBT device 100 in the prior art, the second contact trench is provided between the gate trench and the dummy gate trench and the second contact trench has a greater width and depth, and the function thereof is to shorten the current path of the hole current in the fourth semiconductor region of a first conductivity type between the gate trench and the dummy gate trench, and to suppress the effect of the hole current on the potential rise of the fourth semiconductor region of a first conductivity type, thereby suppressing the latch-up effect and enhancing switching reliability of IGBT. In addition, in order to avoid the risk of shorting the G-E electrode after widening the second contact trench, the spacing between the second contact trench and the adjacent gate trench is larger than the spacing between the second contact trench and the adjacent dummy gate trench. On the other hand, in the conventional IGBT structure, the heavily-doped sixth semiconductor region of a first conductivity type adjoins to be in contact with the side wall and the bottom of the contact trench, respectively; in addition, in the IGBT structure of the present disclosure, the second contact trench adjoins to be in contact with the heavily-doped sixth semiconductor region of a first conductivity type only at a side wall thereof, and the bottom of the second contact trench is deeper than a junction depth of the heavily-doped sixth semiconductor region of a first conductivity type and adjoins to be in contact with the underlying fourth semiconductor region of a first conductivity type, this design has the following four advantages: (1) the heavily-doped sixth semiconductor region of a first conductivity type adjoins the side wall of the second contact trench, and can form a good ohmic contact with the emitter electrode filled in the second contact trench, which is beneficial for suppressing a latch-up effect; (2) the junction depth of the heavily-doped sixth semiconductor region of a first conductivity type is shallower than the depth of the second contact trench, on the one hand, the process difficulty of the deep junction is avoided, and on the other hand, the influence of the problem that the doping impurity of the deep junction has a large lateral diffusion on the channel doping concentration and the threshold voltage Vth near the side wall of the gate trench is avoided; (3) the bottom of the second contact trench adjoins to be in contact with the fourth semiconductor region of a first conductivity type below the second contact trench, and the doping concentration of the fourth semiconductor region of a first conductivity type is generally not higher than $1e18$ $cm^{-3}$, and this contact is a Schottky contact of the first conductivity type; it needs to be pointed out that under various working conditions, such as IGBT forward conduction, turn-off and withstand voltage, the potential of the fourth semiconductor region of a first conductivity type below is slightly higher than the potential of the emitter electrode filled in the second contact trench, so that the Schottky junction of the first conductivity type between the two is in a forward bias state; therefore, there is no Schottky barrier in the path of the hole current flowing from the fourth semiconductor region of a first conductivity type to the second contact trench, i.e., the Schottky contact of the first conductivity type does not affect the collection effect of the second contact trench on the hole current; (4) further, the structure of the present disclosure can be applied to a reverse conduction type RC-IGBT together; when the reverse conduction type RC-IGBT adopting the structure of the present disclosure is in a reverse conduction state, the potential of the emitter electrode filled in the second contact trench is higher than the potential of the fourth semiconductor region of a first conductivity type therebelow, i.e., the Schottky junction of the first conductivity type is in a reverse bias state; therefore, a Schottky barrier exists in the path of the hole current reversely injected from the emitter electrode into the fourth semiconductor region of a first conductivity type, and the Schottky barrier has an inhibitory effect on the injection of the hole current; In addition, the anode emission efficiency of reverse conductivity type RC-IGBT body diode is reduced, the reverse recovery charge is reduced and the reverse recovery speed is accelerated. In addition, the present disclosure also provides a method for manufacturing the structure of the present disclosure without the need for additional masks and other manufacturing costs.

In summary, the IGBT device of the present disclosure can improve the latch-up capability of the IGBT device without affecting the performance such as the energy loss of the device and the manufacturing cost compared with the conventional IGBT device.

DETAILED DESCRIPTION

Embodiments of the IGBT device and a manufacturing method thereof of the present disclosure are specifically illustrated below.

It is to be noted that in the following description of the embodiments of the IGBT device and a manufacturing method thereof of the present disclosure, the semiconductor substrate of the IGBT device is comprised of a silicon (Si) material. However, the substrate may be formed of any other material suitable for IGBT manufacture, such as germanium (Ge), silicon carbide (SiC), etc. In the following description, the dielectric material of the IGBT device may be comprised of $SiO_x$. However, other dielectric materials may be used, such as $Si_xN_y$, $Al_xO_y$, and $Si_xN_yO_z$. In the following description, the conductivity type of the semiconductor region is divided into p-type (first conductivity type) and n-type (second conductivity type). A p-type conductivity semiconductor region may be formed by doping the original semiconductor region with one or more impurities, which may be, but are not limited to: boron (B), aluminum (Al), gallium (Ga), etc. An n-type conductivity semiconductor region may also be formed by doping the original semiconductor region with one or more impurities, which may be, but are not limited to: phosphorus (P), arsenic (As), tellurium (Sb), selenium (Se), protons ($H^+$), etc. In the following description, heavily-doped p-type conductivity semiconductor regions are labeled $p^+$ regions and heavily-doped n-type conductivity semiconductor regions are labeled $n^+$ regions. For example, in a silicon material substrate, unless otherwise specified, a heavily-doped region typically has an impurity concentration of between $1\times10^{19}$ $cm^{-3}$ to $1\times10^{21}$ $cm^{-3}$. In the following description, lightly-doped p-type conductivity semiconductor regions are labeled $p^-$ regions and lightly-doped n-type conductivity semiconductor regions are labeled $n^-$ regions. For example, in a silicon material substrate, unless otherwise specified, a lightly-doped region typically has an impurity concentration of between $1\times10^{19}$ $cm^{-3}$ to $1\times10^{21}$ $cm^{-3}$. In addition, the following examples will illustrate an IGBT device employing an n-type MOS channel, but it should be noted that the disclosure is equally applicable to an IGBT device employing a p-type MOS channel.

It should be noted that corresponding positional words such as "upper", "lower", "left", "right", "front", "rear", "vertical" and "horizontal" described in this document are relative positions corresponding to the reference figures. The fixing direction is not limited in the implementation.

Embodiment 1

Figure 1:
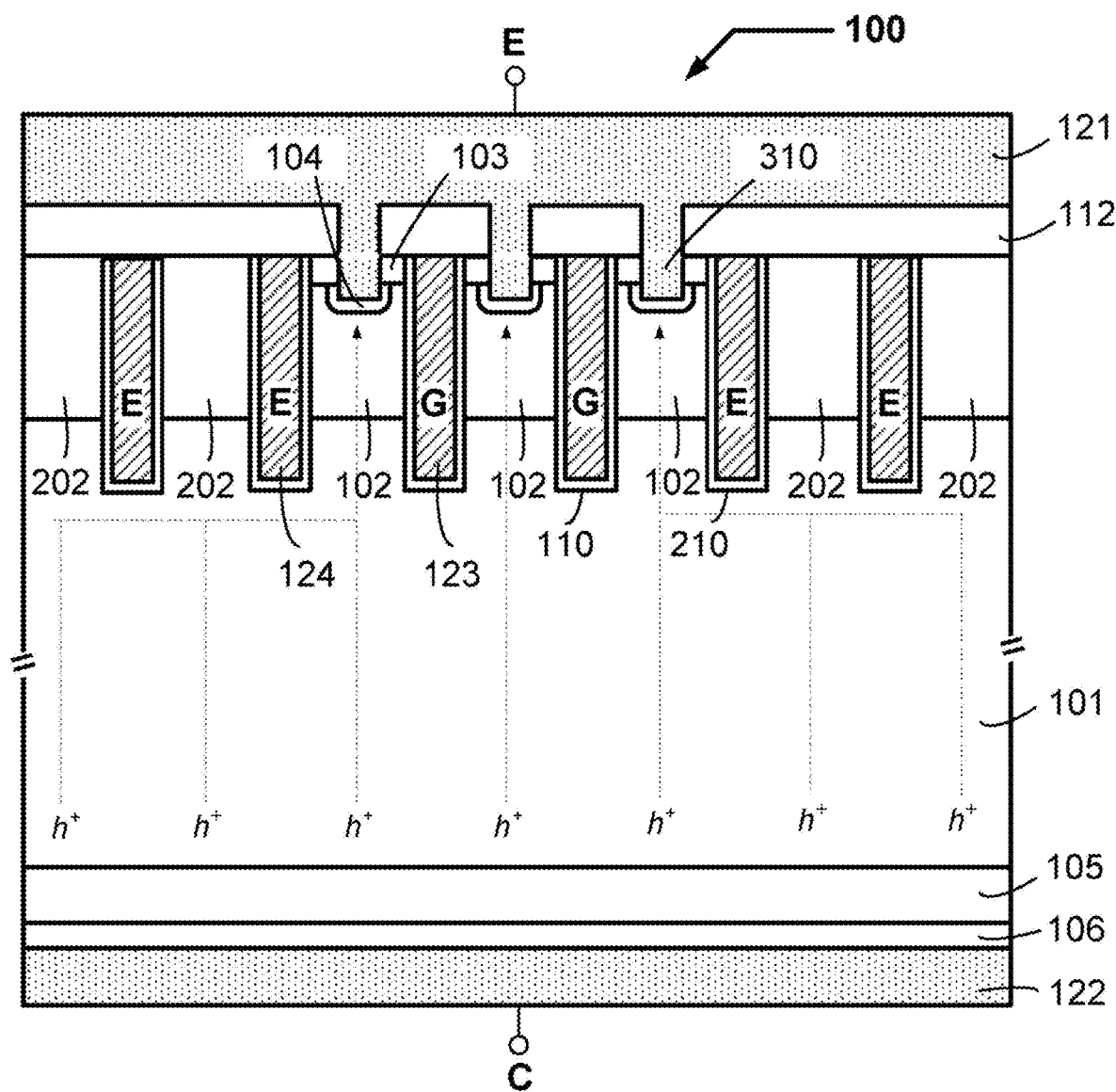
FIG. 1 is a schematic cross-sectional view showing an IGBT device 100 in the prior art.
Figure 2:
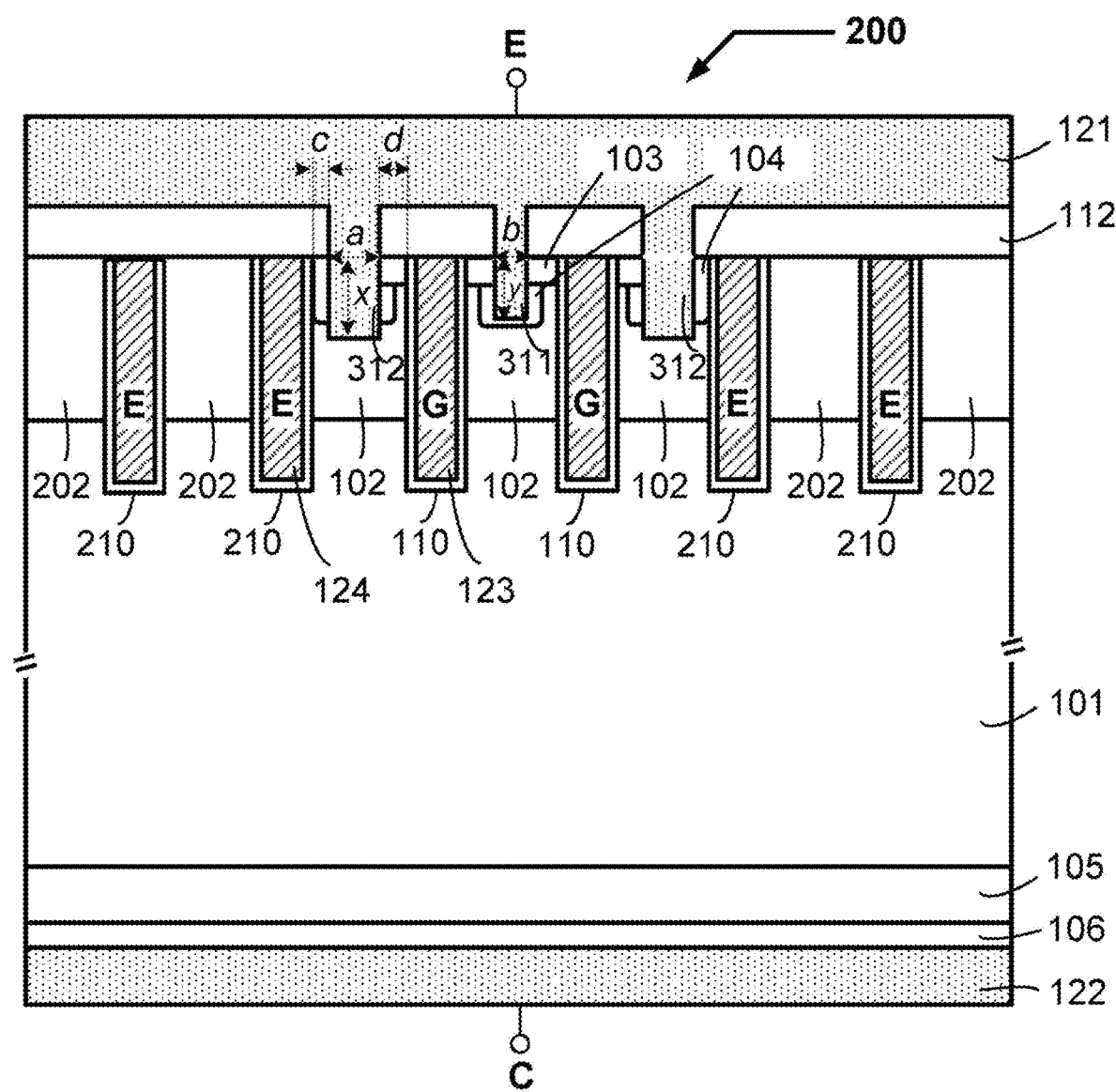
FIG. 2 is a schematic cross-sectional view showing an IGBT device 200 according to a first embodiment of the present disclosure.

FIG. 2 shows a schematic diagram of a cross-sectional structure of an IGBT device 200 of a first embodiment of the present disclosure. The IGBT device 200 comprises an emitter electrode 121, a collector 122 and a gate electrode 123, wherein a p-type first semiconductor layer 106 is provided on the collector 122, an n-type second semiconductor layer 105 is provided on the p-type first semiconductor layer 106, an n-type third semiconductor drift region 101 is provided on the n-type second semiconductor layer 105, more than one gate trench 110 extends from an upper surface of the n-type third semiconductor drift region 101 into the third semiconductor drift region 101, and a gate electrode 123 is provided in the gate trench 110; the n-type third semiconductor drift region 101 is further provided with one or more dummy gate trenches 210 parallel to the gate trench 110 and located near the gate trench 110, the dummy gate electrode 124 is provided in the dummy gate trench 210, and the dummy gate electrode 124 can be coupled to an emitter electrode 121; a p-type fourth semiconductor region 102 and an electrically floating p-type seventh semiconductor region 202 are provided on the third semiconductor drift region 101; the p-type fourth semiconductor region 102 adjoins one side wall of the gate trench 110; the electrically floating p-type seventh semiconductor region 202 is located between two adjacent dummy gate trenches 210; an $n^+$-type fifth semiconductor region 103 is provided on the p-type fourth semiconductor region 102; the $n^+$-type fifth semiconductor region 103 adjoins the same side wall of the gate trench 110; a $p^+$-type sixth semiconductor region 104 is provided above the p-type fourth semiconductor region 102, and the $p^+$-type sixth semiconductor region 104 adjoins the fifth semiconductor region 103; in particular, a first contact trench 311 is provided between two adjacent gate trenches 110, the first contact trench 311 is filled with an emitter electrode 121 and adjoins the $n^+$-type fifth semiconductor region 103 and the $p^+$-type sixth semiconductor region 104, and a second contact trench 312 is provided between one adjacent gate trench 110 and one dummy gate trench 210, the second contact trench is filled with an emitter electrode 121 and adjoins the n$^+$-type fifth semiconductor region 103 and the p$^+$-type sixth semiconductor region 104; the width ("a") and depth ("x") of the second contact trench 312 are greater than the width ("b") and depth ("y") of the first contact trench 311, respectively. Further, the horizontal spacing ("c") between the second contact trench 312 and the adjacent dummy gate trench 210 is less than the horizontal spacing ("d") between the second contact trench 312 and the adjacent gate trench 110. Further, the bottom of the second contact trench 312 is lower than the bottom of the p$^+$-type sixth semiconductor region 104 and adjoins the p-type fourth semiconductor region 102.

The principle of operation of the IGBT device 200 will now be explained as follows. When the device 200 is turned off, although the hole current density in the p-type fourth semiconductor region 102 between the adjacent gate trench 110 and the dummy gate trench 210 is similar to that in the IGBT device 100 in the prior art, the second contact trench 312 is provided between the gate trench 110 and the dummy gate trench 210 of the present disclosure, and the second contact trench 312 has a larger width and depth, and the function thereof is to shorten the current path of the hole current in the p-type fourth semiconductor region 102 between the gate trench 110 and the dummy gate trench 210, and to suppress the effect of the hole current on the potential rise of the p-type fourth semiconductor region 102, thereby suppressing the latch-up effect and enhancing the switching reliability of the IGBT. In addition, in order to avoid the risk of shorting the G-E electrode after widening the second contact trench 312, the spacing between the second contact trench 312 and the adjacent gate trench 110 is larger than the spacing between the second contact trench 312 and the adjacent dummy gate trench 210. On the other hand, in the conventional IGBT structure, the p$^+$-type sixth semiconductor region 104 adjoins to be in contact with the sidewall and the bottom of the contact trench 311, respectively; in addition, in the IGBT structure of the present disclosure, the second contact trench 312 adjoins to be in contact with the p$^+$-type sixth semiconductor region 104 only at its side wall, and the bottom of the second contact trench 312 is deeper than the junction depth of the p$^+$-type sixth semiconductor region 104 and adjoins to be in contact with the underlying p-type fourth semiconductor region 102, this design has the following advantages: (1) the p$^+$-type sixth semiconductor region 104 adjoins the side wall of the second contact trench 312, and can form a good ohmic contact with the emitter electrode 121 filled in the second contact trench 312, which is beneficial for suppressing a latch-up effect; (2) the junction depth of the p$^+$-type sixth semiconductor region 104 is shallower than the depth of the second contact trench 312, on the one hand, the process difficulty of the deep junction is avoided, and on the other hand, the influence of the problem that the doping impurity of the deep junction has a large lateral diffusion on the channel doping concentration and the threshold voltage Vth near the side wall of the gate trench 110 is avoided; (3) the bottom of the second contact trench 312 adjoins to be in contact with the p-type fourth semiconductor region 102 below the second contact trench 312; based on the doping concentration of the p-type fourth semiconductor region 102 being generally not higher than 1e18 cm$^{-3}$, this contact is a p-type Schottky contact; it needs to be pointed out that under various working conditions, such as IGBT forward conduction, turn-off and withstand voltage, the potential of the lower p-type fourth semiconductor region (102) is slightly higher than the potential of the emitter electrode 121 filled in the second contact trench 312, so that the p-type Schottky junction between the two is in a forward bias state; thus there is no Schottky barrier in the path of the hole current from the p-type fourth semiconductor region 102 to the second contact trench 312, i.e. the p-type Schottky contact does not affect the collection of the hole current by the second contact trench 312.

According to the working principle of the IGBT device 200, its corresponding structural parameters are designed as follows. It should be noted that the structural parameters of an IGBT device are related to its rated voltage. The following is an example of a 600V level IGBT to provide the corresponding structural design parameters. In this example, the n-type third semiconductor drift region 101 of the IGBT device 200 may have a thickness of 40 to 80 microns and a doping concentration of 5e13 to 5e14 cm$^{-3}$. The thickness of the back p-type first semiconductor region 106 may be 0.2 to 1 micron and the peak doping concentration may be 5e16 to 1e18 cm$^{-3}$. The back n-type second semiconductor region 105 may have a thickness of 1 to 30 microns and a peak doping concentration of 1e15 to 5e16 cm$^{-3}$. The junction depth of the P-type fourth semiconductor region 102 from the silicon surface may be 1.5 to 4 microns and the peak doping concentration may be 5e16 to 5e17 cm$^{-3}$. The gate trenches 110 and dummy gate trenches 210 may have a trench depth of 4 to 7 microns and a trench width of 0.5 to 2.5 microns. The horizontal spacing between adjacent trenches may be 0.5 to 4 microns. Further, the junction depth of the n$^+$-type fifth semiconductor region 103 from the silicon surface may be 0.1 to 0.5 microns. The junction depth of the p$^+$-type sixth semiconductor region 104 from the silicon surface may be 0.3 to 1 micron. The width "b" and depth "y" of the first contact trench 311 may be 0.2 to 3 microns, and 0.2 to 1 micron, respectively. The width "a" and depth "x" of the second contact trench 312 may be 0.3 to 3.5 microns, and 0.3 to 1.5 microns, respectively. The horizontal spacings "d", "c" of the second contact trenches 312 from the adjacent gate trenches 110 and dummy gate trenches 210 may be 0.1 to 0.5 um, and 0 to 0.4 um, respectively. "a">"b", "c"<"d", and "x">"y" are met.

Embodiment 2

Figure 3:
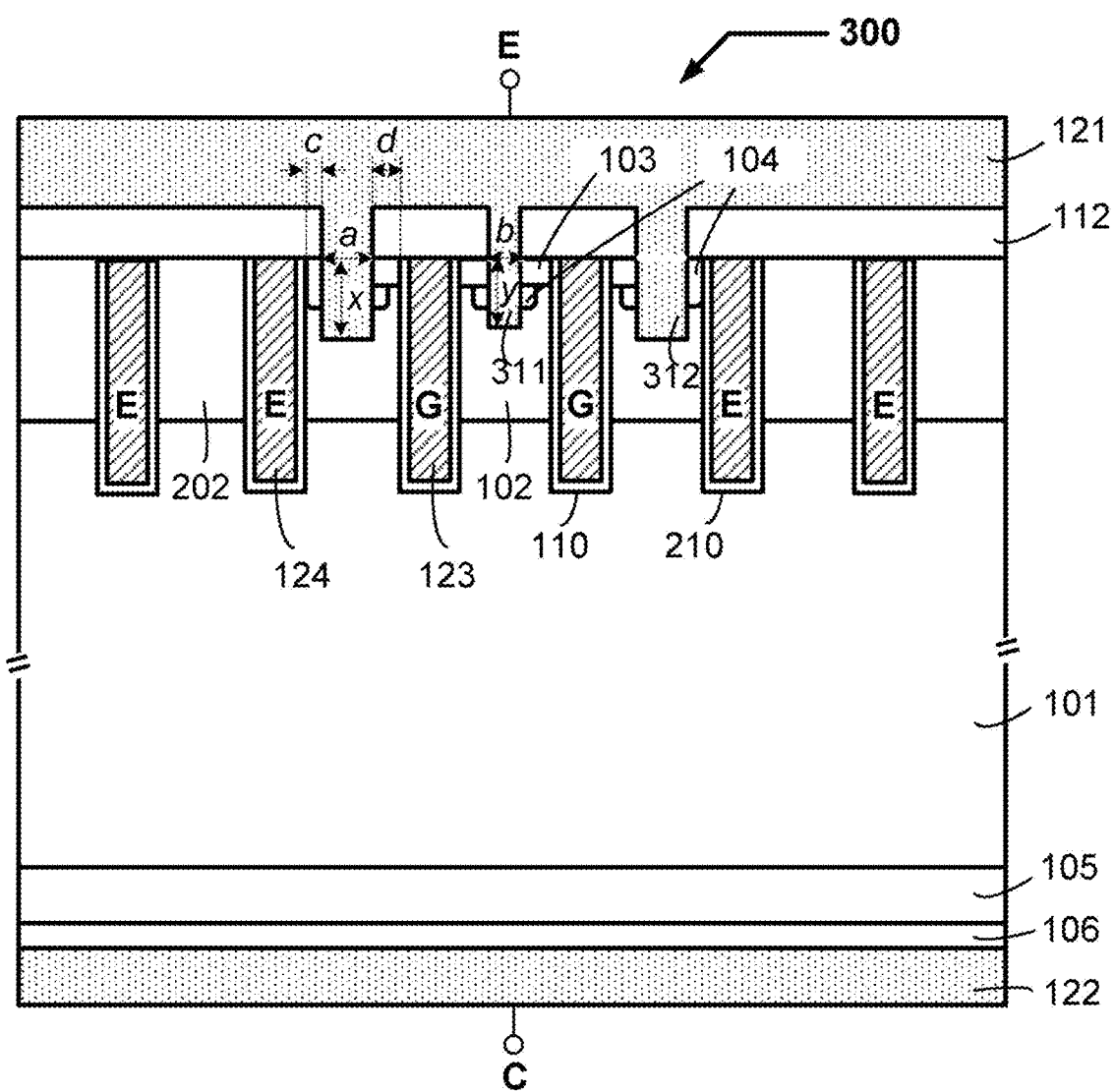
FIG. 3 is a schematic cross-sectional view showing an IGBT device 300 according to a second embodiment of the present disclosure.

FIG. 3 is a schematic cross-sectional view showing an IGBT device 300 according to a second embodiment of the present disclosure. It should be noted that in the drawings of this embodiment and subsequent embodiments of the present disclosure, the same or equivalent structures to those shown in FIG. 2 described above are given the same symbols, and description of the symbols may not be repeated. Unlike the device 200 described in the first embodiment, in the device 300 of the present embodiment, the bottom of the first contact trench 311 is also deeper than the bottom of the p$^+$-type sixth semiconductor region 104 and adjoins the p-type fourth semiconductor region 102. The deeper first contact trench 311 also helps to enhance the latch-up resistant capability of the device.

Embodiment 3

Figure 4:
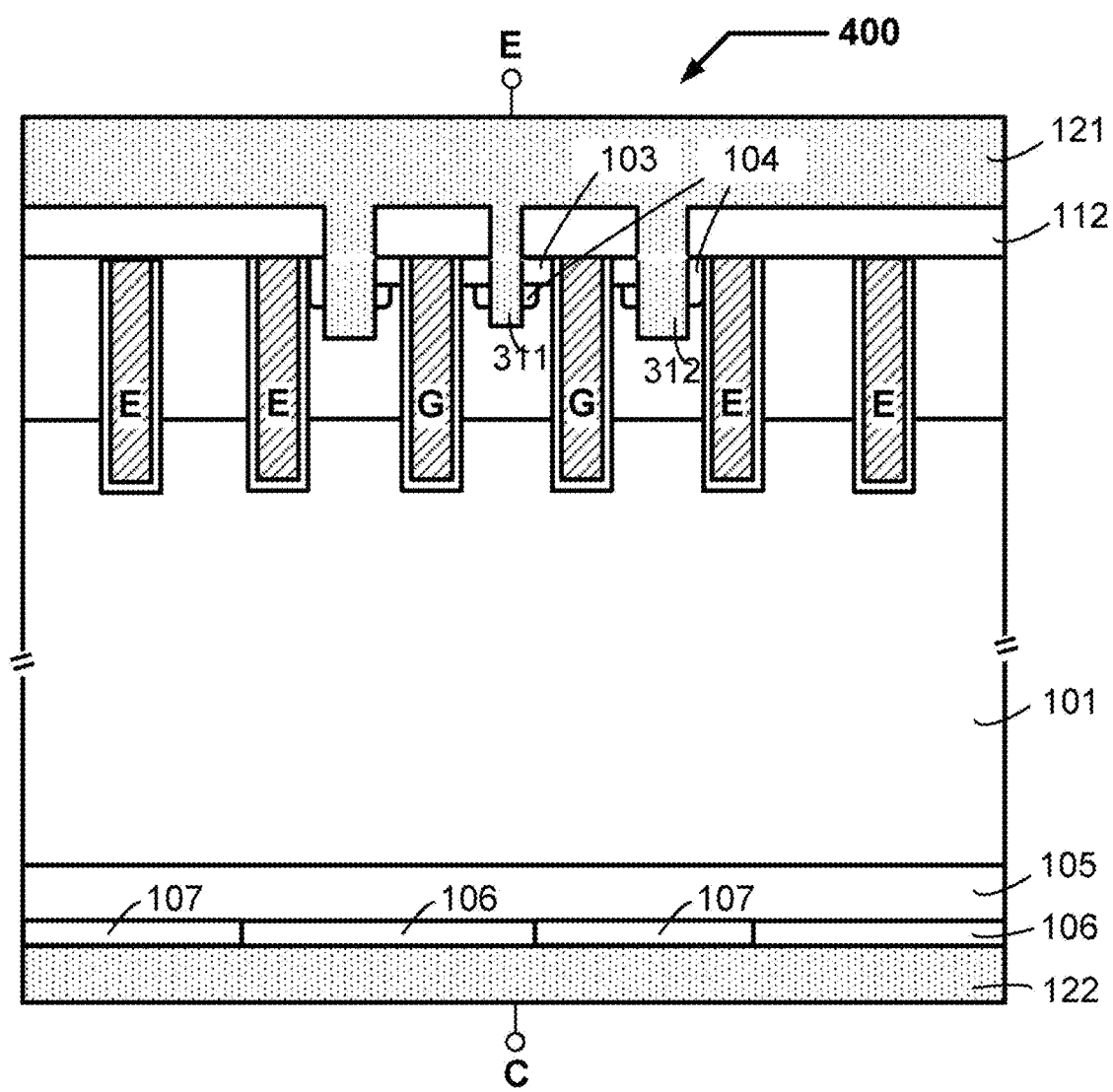
FIG. 4 is a schematic cross-sectional view showing an IGBT device 400 according to a third embodiment of the present disclosure.

FIG. 4 is a schematic cross-sectional view showing an IGBT device 400 according to a third embodiment of the present disclosure. Unlike the device 300 described in the second embodiment, in the device 400 of the present embodiment, the p-type first semiconductor region 106 and the n$^+$-type eighth semiconductor region 107 are arranged alternately above the bottom collector 122, i.e. the device 400 is a reverse conducting RC-IGBT device. When the device 400 is in a reverse conduction state, the potential of the emitter electrode 121 filled in the second contact trench 312 is higher than the potential of the p-type fourth semiconductor region 102 therebelow, resulting in that the p-type Schottky junction between the second contact trench 312 and the p-type fourth semiconductor region 102 is in a reverse bias state; therefore, a Schottky barrier exists in the path of the hole current reversely implanted from the emitter electrode 121 into the p-type fourth semiconductor region 102, and the Schottky barrier has an inhibitory effect on the injection of the hole current, thereby reducing the anode emission efficiency of the body diode of the device 400, reducing the reverse recovery charge and increasing the reverse recovery speed.

Embodiment 4

Figure 5:
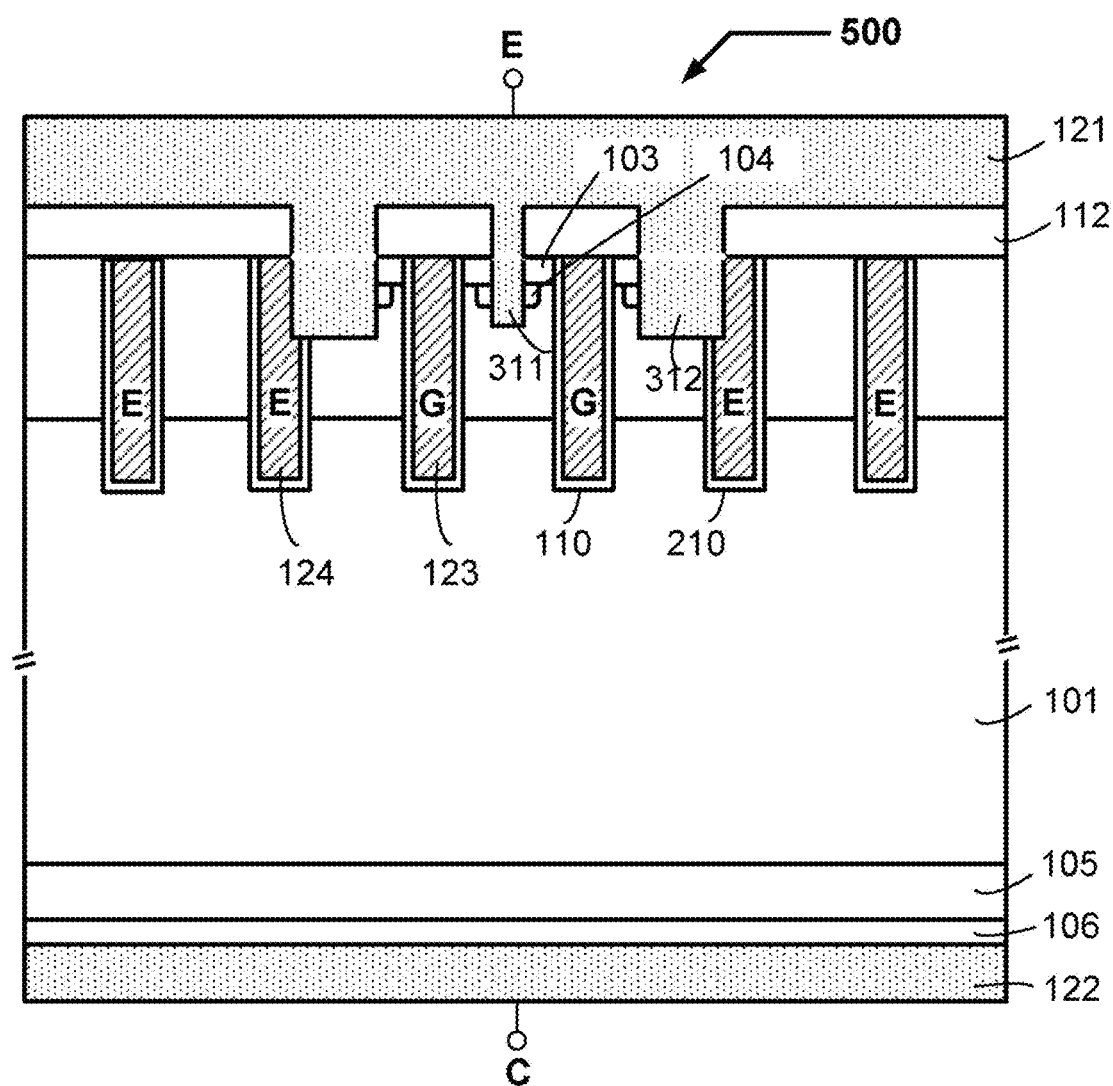
FIG. 5 is a schematic cross-sectional view showing an IGBT device 500 according to a fourth embodiment of the present disclosure.

FIG. 5 is a schematic cross-sectional view showing an IGBT device 500 according to a fourth embodiment of the present disclosure. Unlike the device 300 described in the second embodiment, in the device 500 of this embodiment, the second contact trench 312 adjoins one sidewall of an adjacent dummy gate trench 210. This design may reduce the aspect ratio of the second contact trench 312, improving the fillability of the metal electrode within the second contact trench 312.

Embodiment 5

Figure 6:
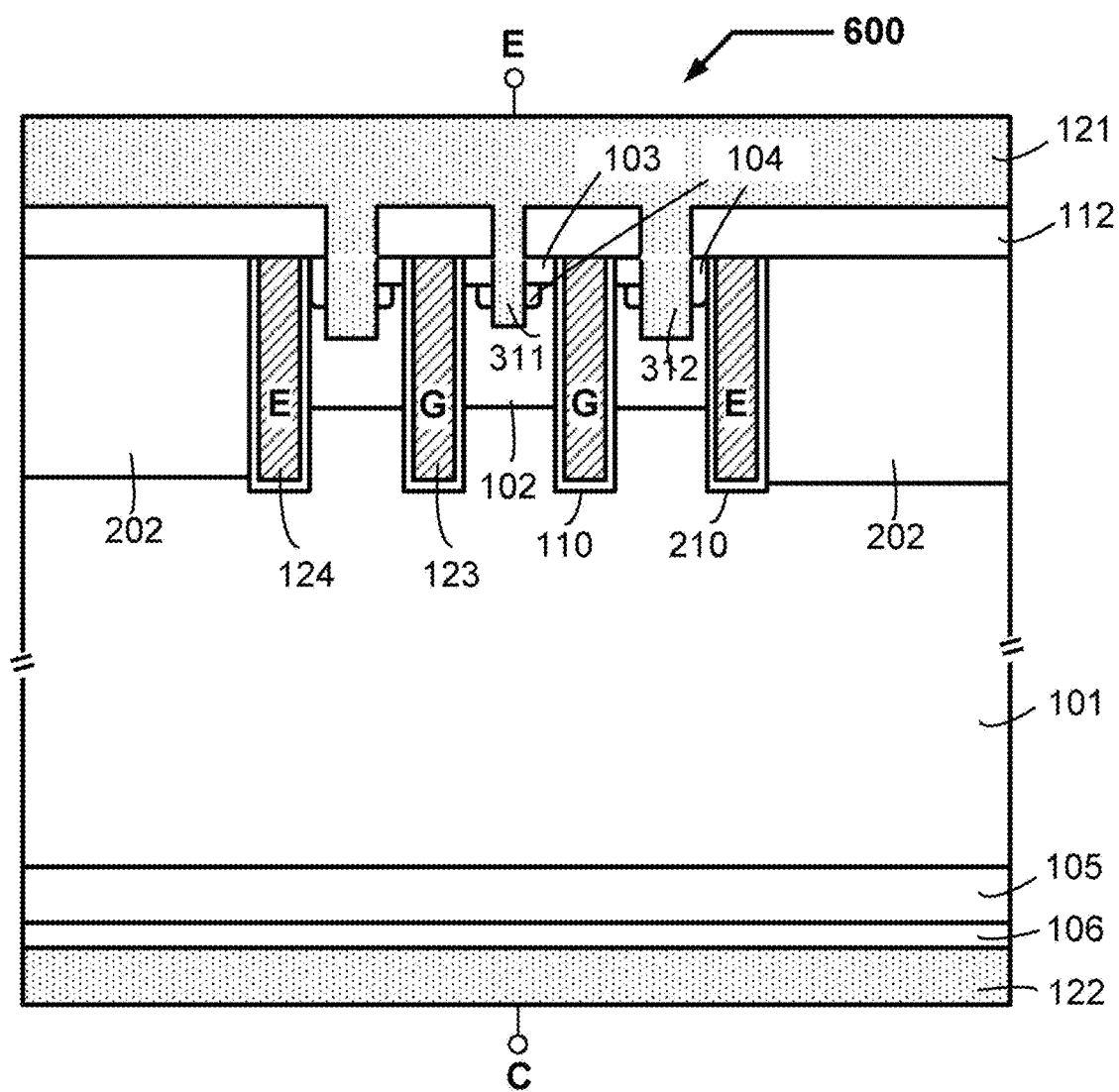
FIG. 6 is a schematic cross-sectional view showing an IGBT device 600 according to a fifth embodiment of the present disclosure.

FIG. 6 is a schematic cross-sectional view showing an IGBT device 600 according to a fifth embodiment of the present disclosure. Unlike the device 300 described in the second embodiment, in the device 600 of this embodiment, the junction depth of the electrically floating p-type seventh semiconductor region 202 between adjacent dummy gate trenches 210 is deeper than the p-type fourth semiconductor region 102. This design helps to increase the withstand voltage of the device.

Embodiment 6

Figure 7:
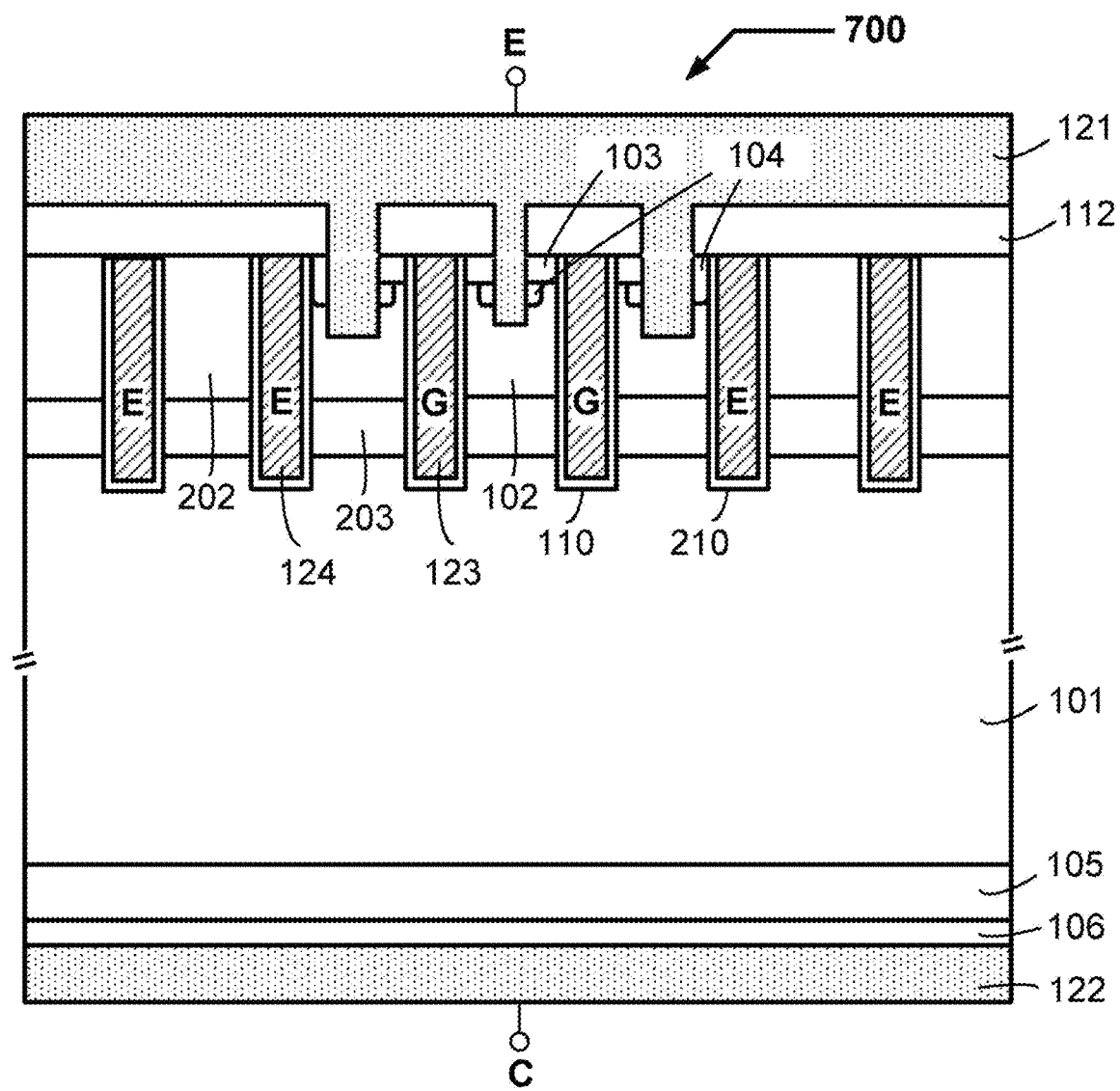
FIG. 7 is a schematic cross-sectional view showing an IGBT device 700 according to a sixth embodiment of the present disclosure.

FIG. 7 is a schematic cross-sectional view showing an IGBT device 700 according to a sixth embodiment of the present disclosure. Unlike the device 300 described in the second embodiment, in the device 700 of the present embodiment, an n-type ninth semiconductor region 203 is further provided between the n-type third semiconductor drift region 101 and the p-type fourth semiconductor region 102, and the peak doping concentration of the n-type ninth semiconductor region 203 is 1e15-1e17 cm$^{-3}$, and the function thereof is to help further reduce the drop voltage of the device in the IGBT forward conduction state.

Embodiment 7

Figure 8:
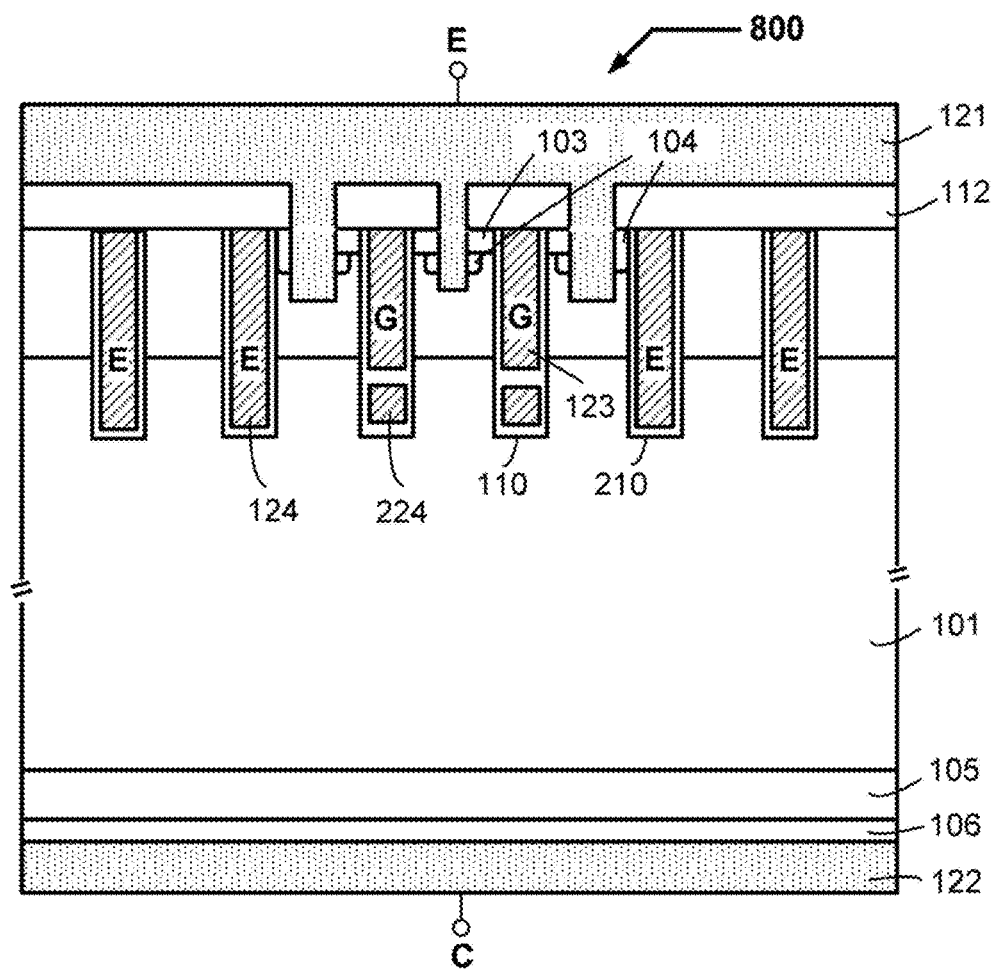
FIG. 8 is a schematic cross-sectional view showing an IGBT device 800 according to a seventh embodiment of the present disclosure.

FIG. 8 is a schematic cross-sectional view showing an IGBT device 800 according to a seventh embodiment of the present disclosure. Unlike the device 300 described in the second embodiment, in the device 800 of the present embodiment, an auxiliary electrode 224 is provided inside the gate trench 110, located below the gate electrode 123 and is physically separated from the gate electrode 123 by an insulating material such as an oxide layer, and the auxiliary electrode 224 may be coupled to an emitter electrode 121. The effect of this design is to help further reduce the parasitic gate capacitance and switching losses of the IGBT.

In addition, the present disclosure also provides a method for manufacturing the IGBT device 300 implementing the second embodiment.

Figure 9:
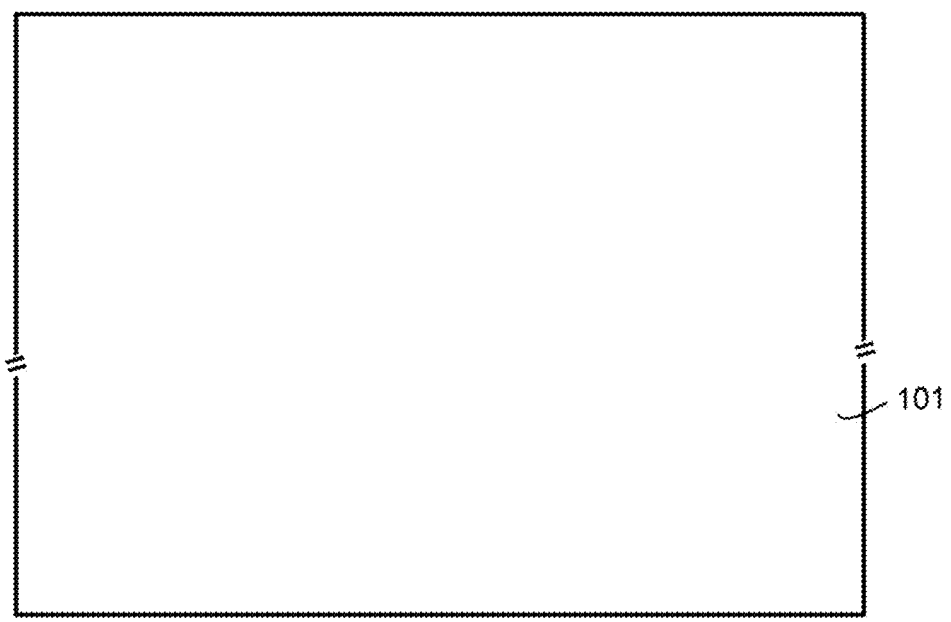
FIGS. 9-16 illustrate a method for manufacturing an IGBT device 300 according to a second embodiment of the present disclosure.
Figure 10:
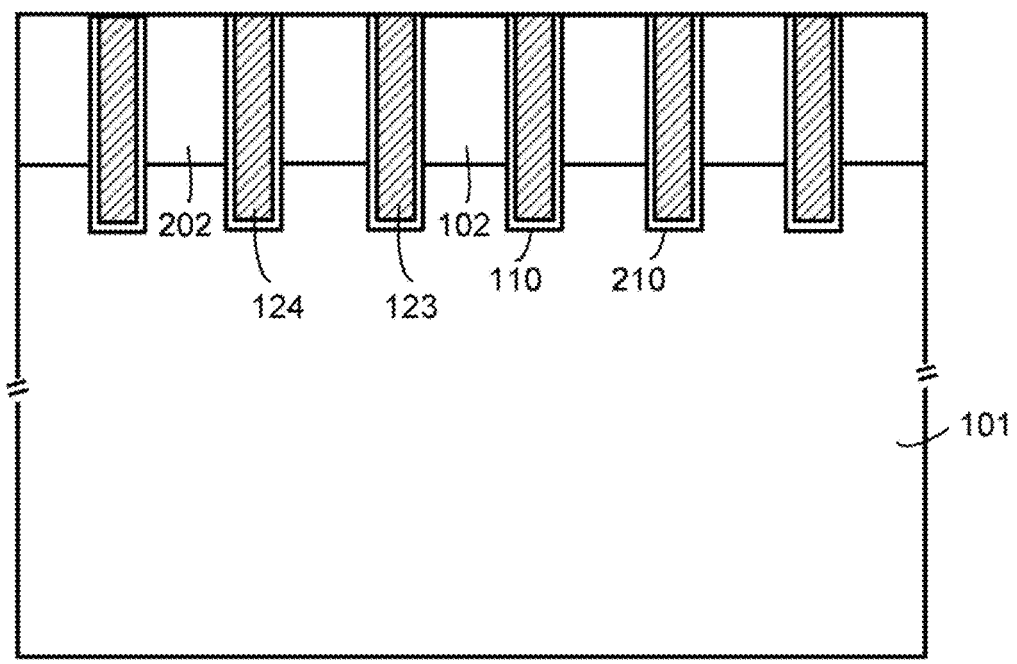
Figure 11:
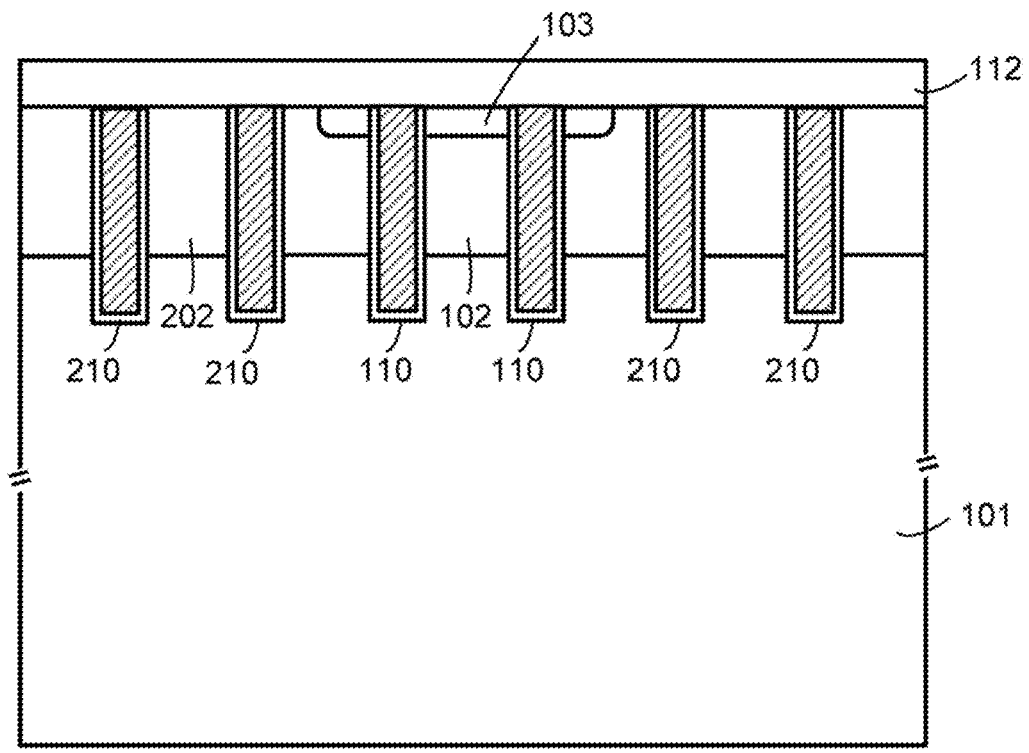
Figure 12:
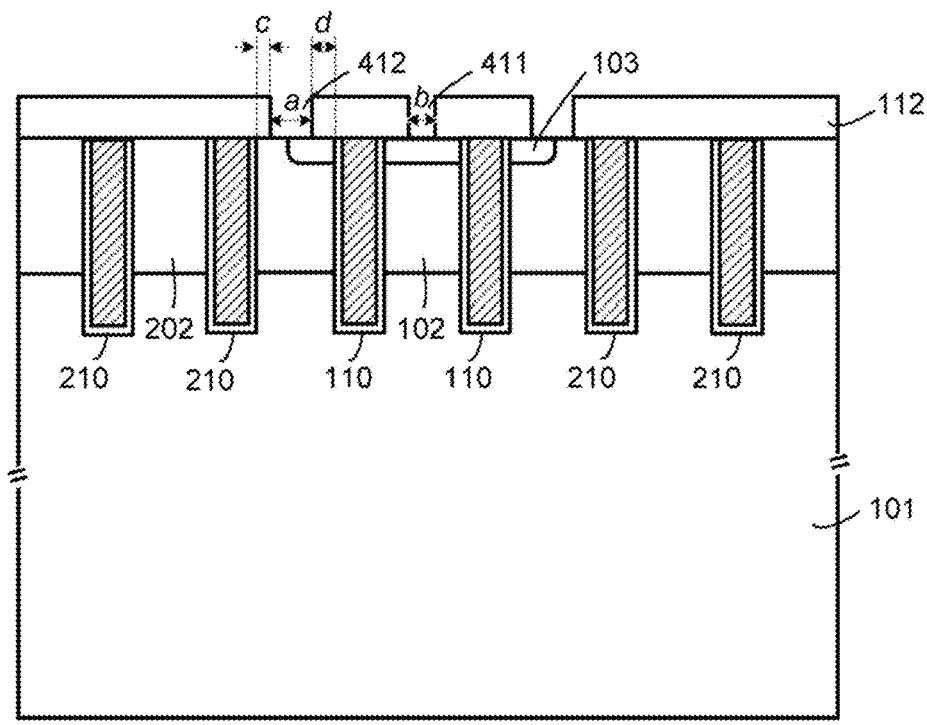
Figure 13:
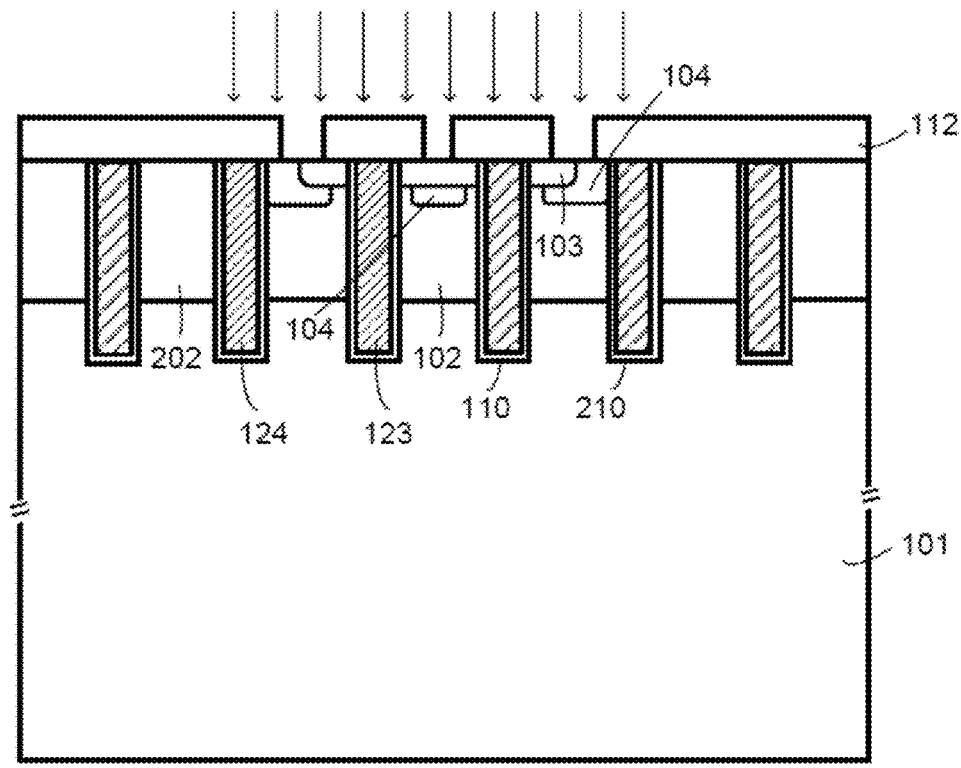
Figure 14:
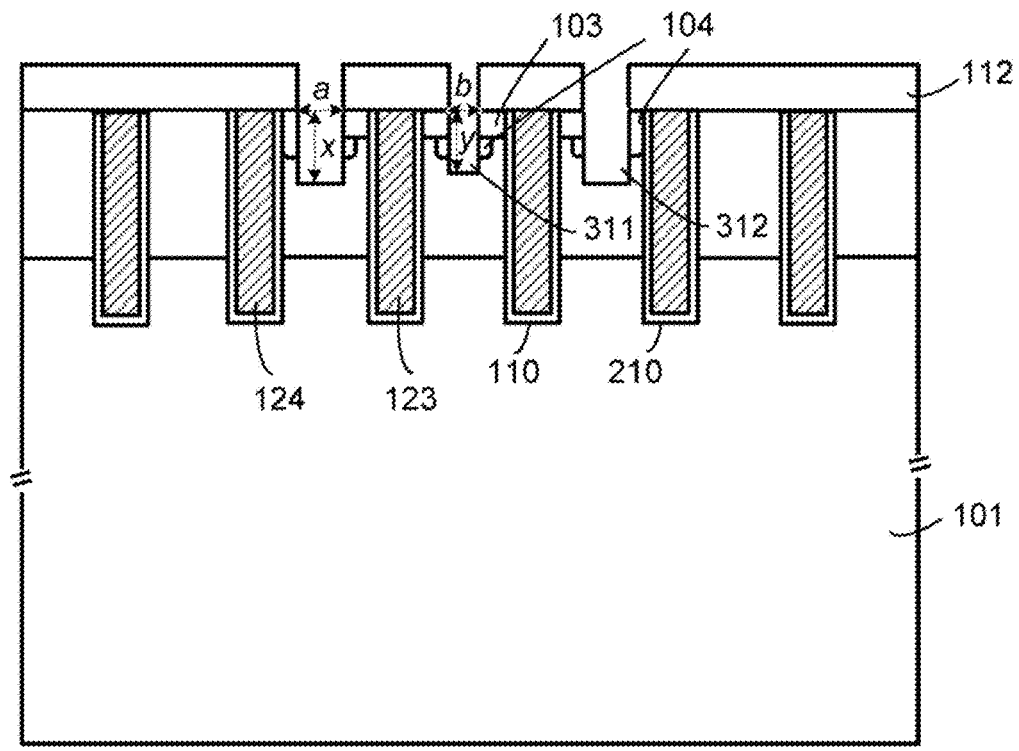
Figure 15:
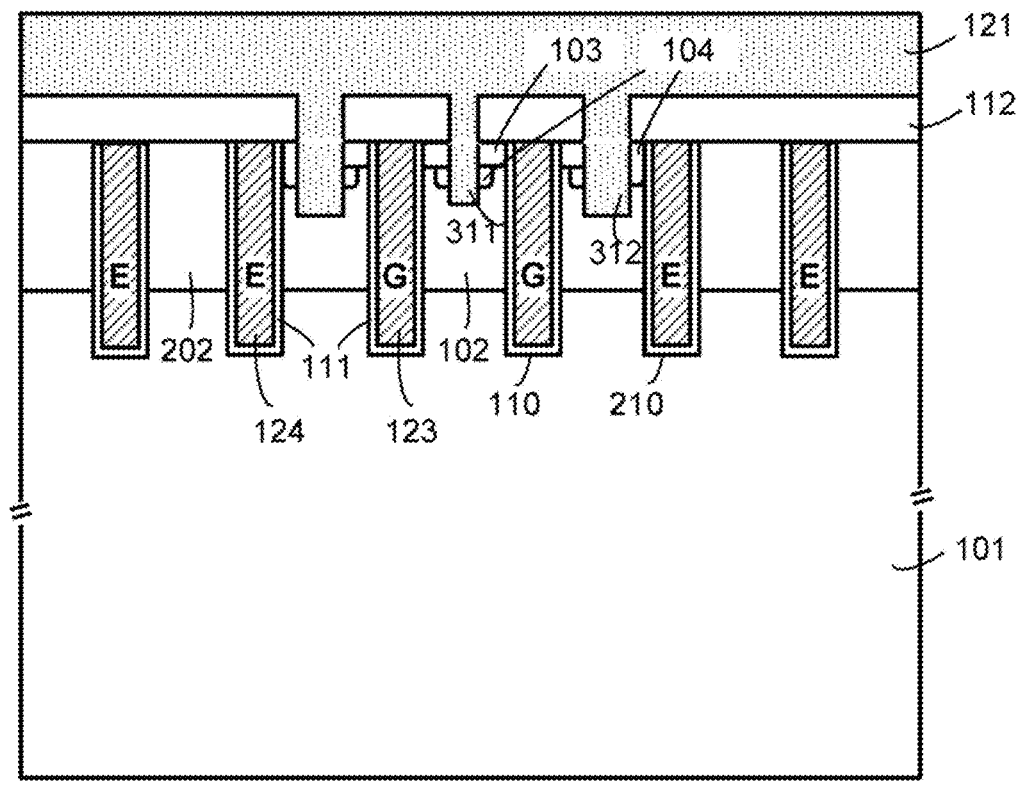
Figure 16:
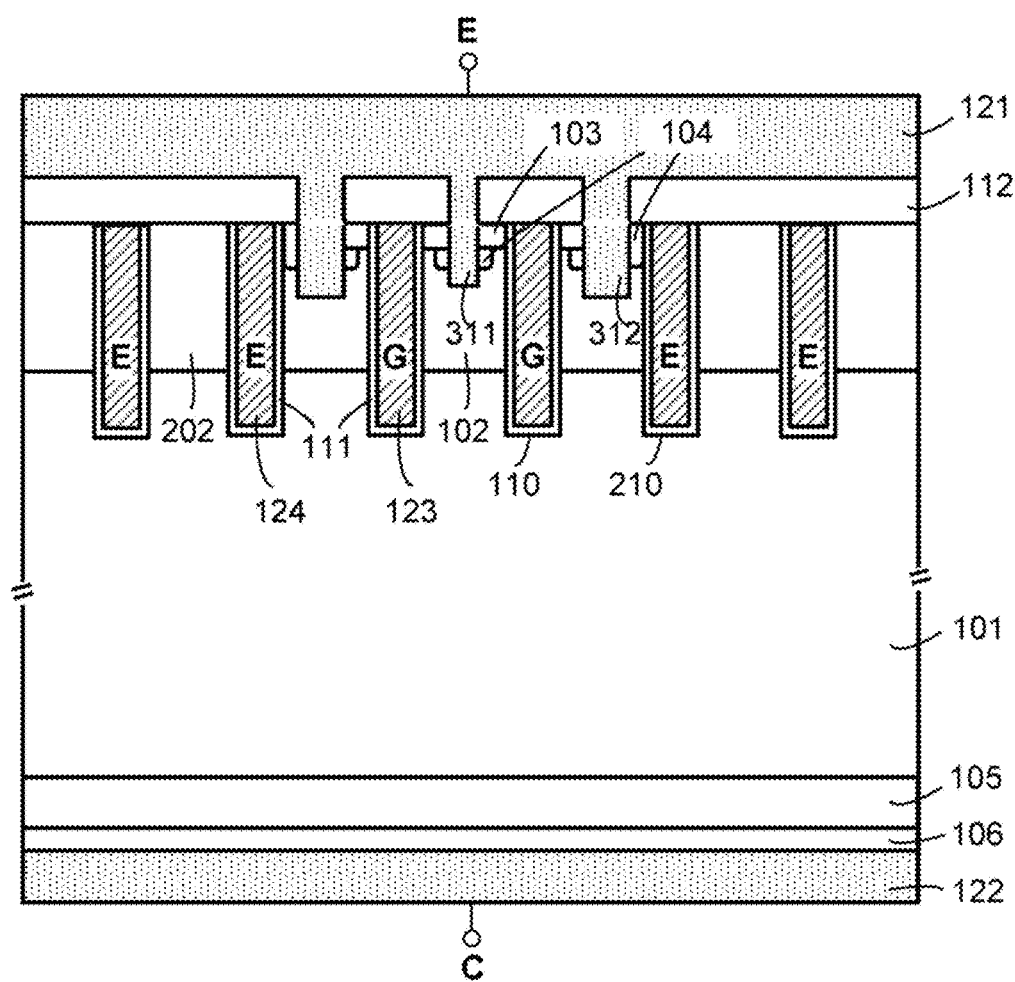

First, as shown in FIG. 9, an n-type semiconductor region 101 is formed;

second, as shown in FIG. 10, a gate trench 110, a dummy gate trench 210, a p-type fourth semiconductor region 102 and a p-type seventh semiconductor region 202 are formed on the upper surface of the n-type semiconductor region 101 through processes such as trench etching, gate oxide oxidation, polysilicon backfilling, ion implantation and annealing;

third, as shown in FIG. 11, an n$^+$-type fifth semiconductor region 103 is formed on the upper surface of the p-type fourth semiconductor region 102 by ion implantation and annealing, and a layer of insulating dielectric layer 112 is deposited on the upper surface, wherein the insulating dielectric layer may be composed of SiO$_2$;

fourth, as shown in FIG. 12, mask etching is performed on the insulating dielectric layer 112 to respectively form a first etched hole 411 located between two adjacent gate trenches 110 and a second etched hole 412 located between one adjacent gate trench 110 and one dummy gate trench 210, wherein the first etched hole 411 and the second etched hole 412 are in contact with the upper surface of the n$^+$-type fifth semiconductor region 103, in particular, the width ("a") of the second etched hole 412 is greater than the width ("b") of the first etched hole 411; the horizontal spacing ("c") between the second etched hole 412 and the adjacent dummy gate trench 210 is less than the horizontal spacing ("d") between same and the adjacent gate trench 110;

fifth, as shown in FIG. 13, the remaining insulating dielectric layer 112 is used as a mask, p-type ions are implanted below the first etched hole and the second etched hole, and a p$^+$-type sixth semiconductor region 104 is formed by annealing;

sixth, as shown in FIG. 14, trench etching is performed with the remaining insulating dielectric layer 112 as a mask, and a first contact trench 311 and a second contact trench 312 are synchronously formed; due to the "loading effect" of the trench etching, a trench with a larger width will form a deeper trench depth in the etching, i.e., realizing that the depth ("x") of the second contact trench 312 is greater than the depth ("y") of the first contact trench 311, and the first and second contact trenches are formed in the synchronous etching, and therefore an additional mask does not need to be added;

seventh, as shown in FIG. 15, surface metal deposition is performed to form an emitter electrode 121;

eighth, as shown in FIG. 16, the n-type semiconductor region 101 is moderately thinned from its lower surface to reach a target thickness determined by a device withstand voltage value, and then a second semiconductor layer 105 and a first semiconductor layer 106 are formed at the bottom of the thinned n-type semiconductor region 101 through an ion implantation and activation process; and ninth, metalizing is performed at the bottom of the device to form a collector 122.

The invention claimed is:

1. A power semiconductor device, comprising an emitter, a collector and a gate electrode, a first semiconductor layer of a first conductivity type being provided on the collector, a second semiconductor layer of a second conductivity type being provided on the first semiconductor layer of the first conductivity type, and a lightly-doped third semiconductor drift region of the second conductivity type being provided on the second semiconductor layer of the second conductivity type;
    the lightly-doped third semiconductor drift region of the second conductivity type being provided therein with one or more gate trenches extending from an upper surface of the lightly-doped third semiconductor drift region of the second conductivity type into the third semiconductor drift region, one or more dummy gate trenches parallel to the gate trenches and located near the gate trenches, an electrically floating seventh semiconductor region of the first conductivity type located between adjacent dummy gate trenches and a fourth semiconductor region of the first conductivity type located at a side of the gate trench; a gate electrode being provided in the gate trench, a dummy gate electrode being provided in the dummy gate trench, and the dummy gate electrode being coupled to the emitter electrode;
    a heavily-doped fifth semiconductor region of the second conductivity type and a heavily-doped sixth semiconductor region of a first conductivity type being provided on the fourth semiconductor region of a first conductivity type, the heavily-doped fifth semiconductor region of the second conductivity type adjoining the same side wall of the gate trench, and the heavily-doped sixth semiconductor region of a first conductivity type adjoining the fifth semi conductor region;
    an insulating dielectric layer located on the lightly-doped third semiconductor drift region of the second conductivity type;
    wherein a first contact trench is provided between two adjacent gate trenches, a second contact trench is provided between the gate trench and a dummy gate trench, the emitter electrode fills down into the first contact trench and the second contact trench, the first contact trench and the second contact trench adjoin the heavily-doped sixth semiconductor region of the first conductivity type and the fifth semiconductor region at a side thereof respectively, and the width and depth of the second contact trench are respectively greater than those of the first contact trench;
    the bottom of the second contact trench is deeper than a junction depth of the heavily-doped sixth semiconductor region of a first conductivity type and adjoins to be in contact with the underlying fourth semiconductor region of a first conductivity type.

2. The power semiconductor device according to claim 1, wherein a horizontal spacing between the second contact trench and the adjacent dummy gate trench is less than the horizontal spacing between the second contact trench and the adjacent gate trench.

3. The power semiconductor device according to claim 1, wherein the bottom of the first contact trench is deeper than the bottom of the heavily-doped sixth semiconductor region of a first conductivity type and adjoins the underlying fourth semiconductor region of a first conductivity type.

4. The power semiconductor device according to claim 1, wherein a first semiconductor region of the first conductivity type and a heavily-doped eighth semiconductor region of the second conductivity type are provided in an alternating arrangement over the collector.

5. The power semiconductor device according to claim 1, wherein the second contact trench adjoins a side wall of the dummy gate trench on a side thereof.

6. The power semiconductor device according to claim 1, wherein the junction depth of the electrically floating seventh semiconductor region of a first conductivity type between adjacent dummy gate trenches is deeper than the junction depth of the fourth semiconductor region of a first conductivity type.

7. The power semiconductor device according to claim 1, wherein a ninth semiconductor region of the second conductivity type is provided between the lightly-doped third semiconductor drift region of the second conductivity type and the fourth semiconductor region of a first conductivity type.

8. The power semiconductor device according to claim 1, wherein an auxiliary electrode is provided inside the gate trench and located below and isolated from the gate electrode.

9. The power semiconductor device according to claim 8, wherein the auxiliary electrode is coupled to the emitter electrode.

10. A method for manufacturing the power semiconductor device according to claim 1, wherein the method comprises the steps of:
    first, forming a lightly-doped semiconductor region of the second conductivity type;
    second, forming a gate trench, a dummy gate trench, a fourth semiconductor region of a first conductivity type and a seventh semiconductor region of a first conductivity type on an upper surface of the lightly-doped semiconductor region of the second conductivity type;
    third, forming a heavily-doped fifth semiconductor region of the second conductivity type on an upper surface of the fourth semiconductor region of a first conductivity type by ion implantation and annealing, and depositing an insulating dielectric layer on the upper surface;
    fourth, performing mask etching on the insulating dielectric layer, respectively forming a first etched hole located between two adjacent gate trenches and a second etched hole located between the adjacent gate trench and dummy gate trench, wherein the first etched hole and the second etched hole are in contact with the upper surface of the heavily-doped fifth semiconductor region of the second conductivity type, the width of the second etched hole is greater than the width of the first etched hole, and the horizontal spacing between the second etched hole and the adjacent dummy gate trench is less than the horizontal spacing between same and the adjacent gate trench;
    fifth, using the remaining insulating dielectric layer as a mask, implanting ions of the first conductivity type below the first etched hole and the second etched hole, and forming a heavily-doped sixth semiconductor region of a first conductivity type by annealing;
    sixth, performing trench etching with the remaining insulating dielectric layer as a mask, and synchronously forming a first contact trench and a second contact trench;
    seventh, performing surface metal deposition to form an emitter;
    eighth, moderately thinning the lightly-doped semiconductor region of the second conductivity type from its lower surface to reach a target thickness determined by a device withstand voltage value, and then forming a second semiconductor layer and a first semiconductor layer at the bottom of the thinned lightly-doped semiconductor region of the second conductivity type through an ion implantation and activation process; and ninth, metalizing at the bottom of the device to form a collector.

\* \* \* \* \*